(12) United States Patent
Sedlmaier et al.

(10) Patent No.: US 7,821,033 B2
(45) Date of Patent: *Oct. 26, 2010

(54) SEMICONDUCTOR COMPONENT COMPRISING A DRIFT ZONE AND A DRIFT CONTROL ZONE

(75) Inventors: Stefan Sedlmaier, Munich (DE); Anton Mauder, Kolbermoor (DE); Armin Willmeroth, Augsburg (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 11/706,860

(22) Filed: Feb. 15, 2007

(65) Prior Publication Data

US 2008/0197380 A1    Aug. 21, 2008

(51) Int. Cl.
*H01L 29/78* (2006.01)
*H01L 21/336* (2006.01)

(52) U.S. Cl. .............. 257/192; 257/E31.046; 257/E31.049; 257/E21.182; 257/E21.207; 257/328

(58) Field of Classification Search ........ 257/244, 257/263, 273, 278, 328, 301, 302, 329, 330, 257/341, E31.046, E31.049, E29.193, E21.182, 257/E21.207, E29.012, E29.256, 192
See application file for complete search history.

(56) References Cited

U.S. PATENT DOCUMENTS

| 5,326,711 | A | * | 7/1994 | Malhi ................ 438/138 |
| 5,510,641 | A | * | 4/1996 | Yee et al. .............. 257/367 |
| 5,567,629 | A | | 10/1996 | Kubo |
| 5,920,088 | A | * | 7/1999 | Augusto ............... 257/192 |
| 6,774,434 | B2 | | 8/2004 | Hueting et al. |
| 6,777,780 | B2 | * | 8/2004 | Hueting et al. .......... 257/565 |
| 7,459,365 | B2 | * | 12/2008 | Rub et al. .............. 438/268 |
| 2003/0094649 | A1 | * | 5/2003 | Hueting et al. .......... 257/328 |
| 2005/0121718 | A1 | * | 6/2005 | Nakayama et al. ........ 257/335 |
| 2006/0255401 | A1 | * | 11/2006 | Yang et al. .............. 257/328 |
| 2007/0023830 | A1 | | 2/2007 | Pfirsch et al. |
| 2008/0197441 | A1 | * | 8/2008 | Mauder et al. ........... 257/487 |

FOREIGN PATENT DOCUMENTS

| DE | 101 26 309 A1 | 12/2002 |
| WO | WO 02/41404 A2 | 5/2002 |
| WO | WO 2007/012490 A2 | 2/2007 |

OTHER PUBLICATIONS

Masashi Shima, Strained-SiGe-Channel p-MOSFET with Enhanced Hole Mobility and Lower Parasitic Resistance, Fujitsu Sci. Tech. J., Jun. 2003, p. 79-83.

* cited by examiner

*Primary Examiner*—Leonardo Andújar
*Assistant Examiner*—Teresa M Arroyo
(74) *Attorney, Agent, or Firm*—Maginot, Moore & Beck

(57) ABSTRACT

A semiconductor component is disclosed herein comprising a drift zone and a drift control zone. The drift control zone is arranged adjacent to the drift zone and is dielectrically insulated from the drift zone by a dielectric layer. The drift control zone includes at least one first semiconductor layer and one second semiconductor layer. The first semiconductor layer has a higher charge carrier mobility than the second semiconductor layer.

13 Claims, 8 Drawing Sheets

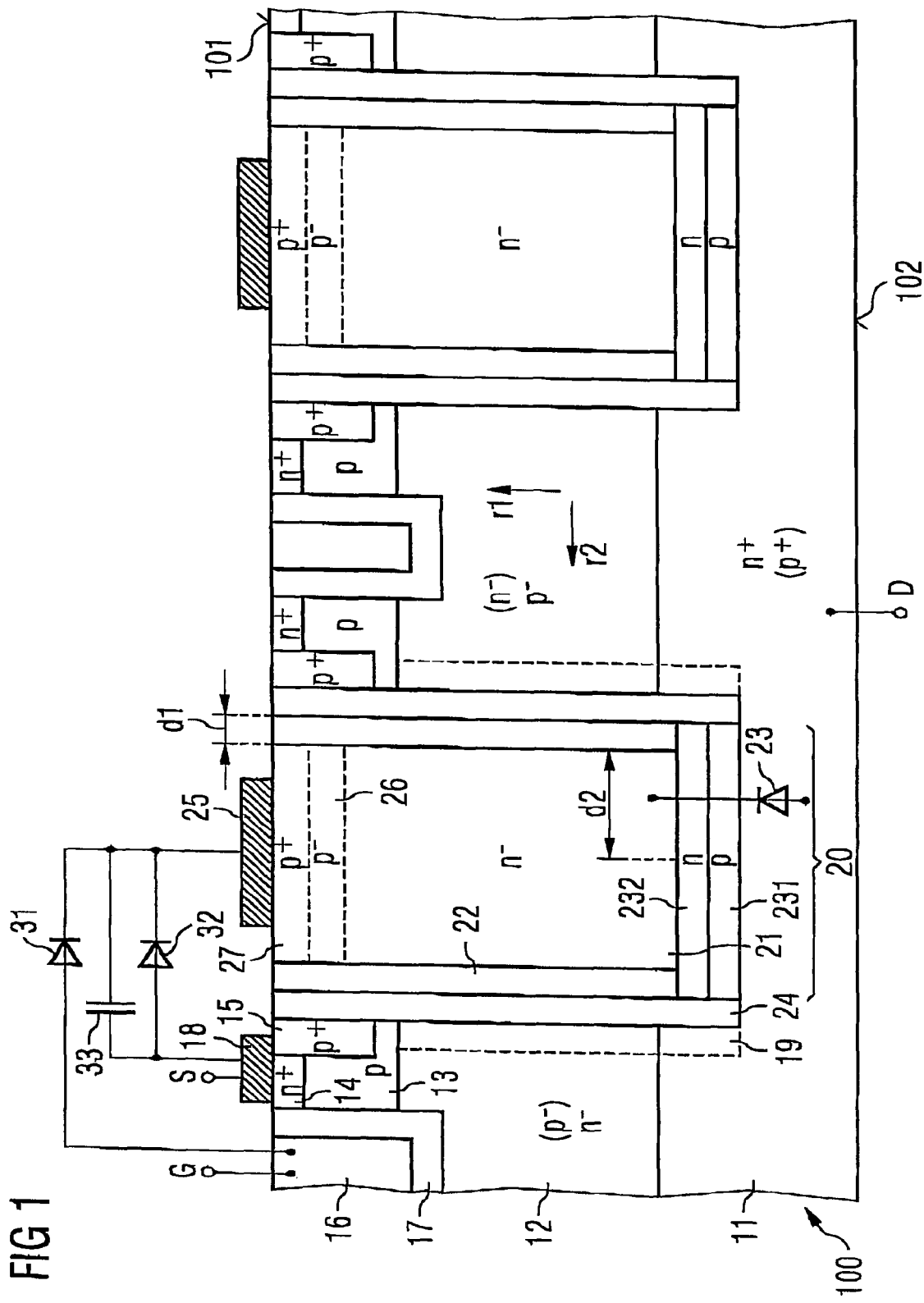

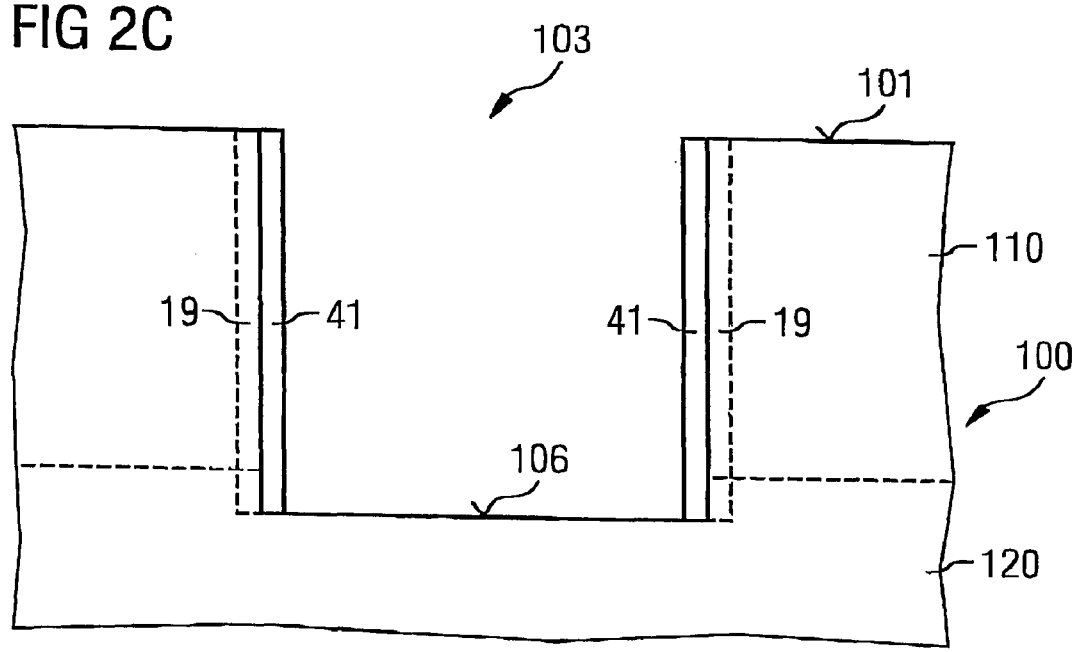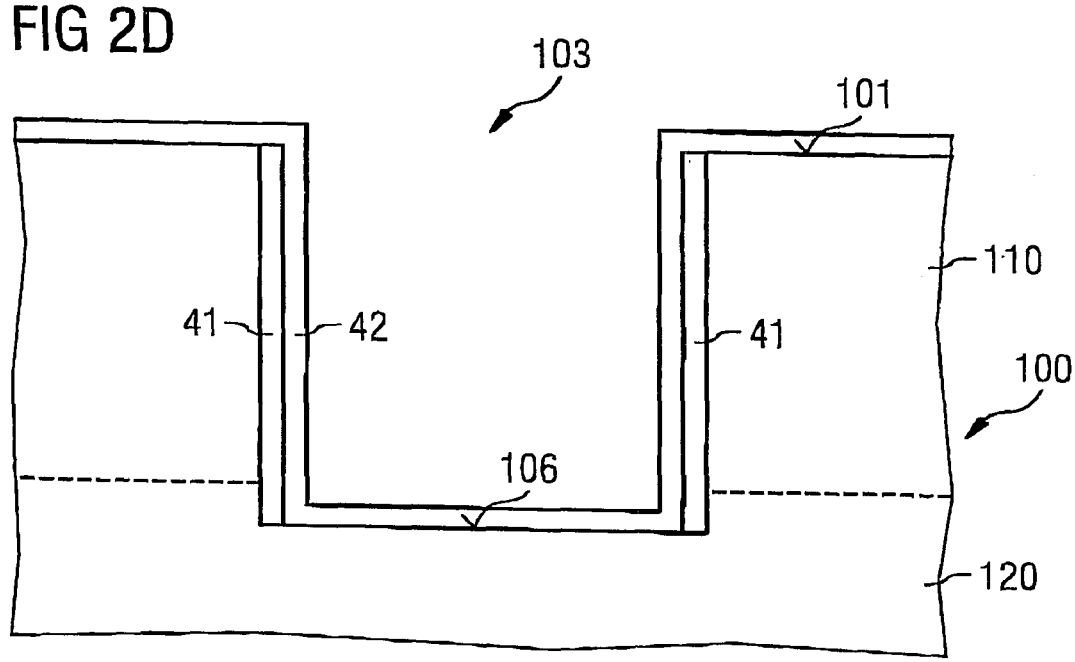

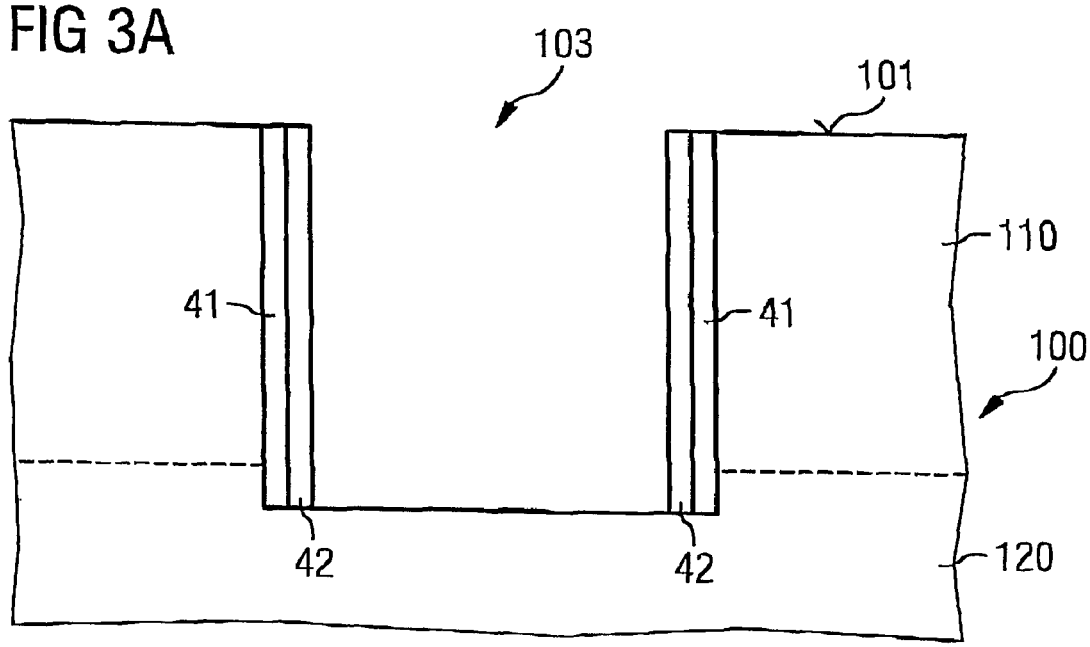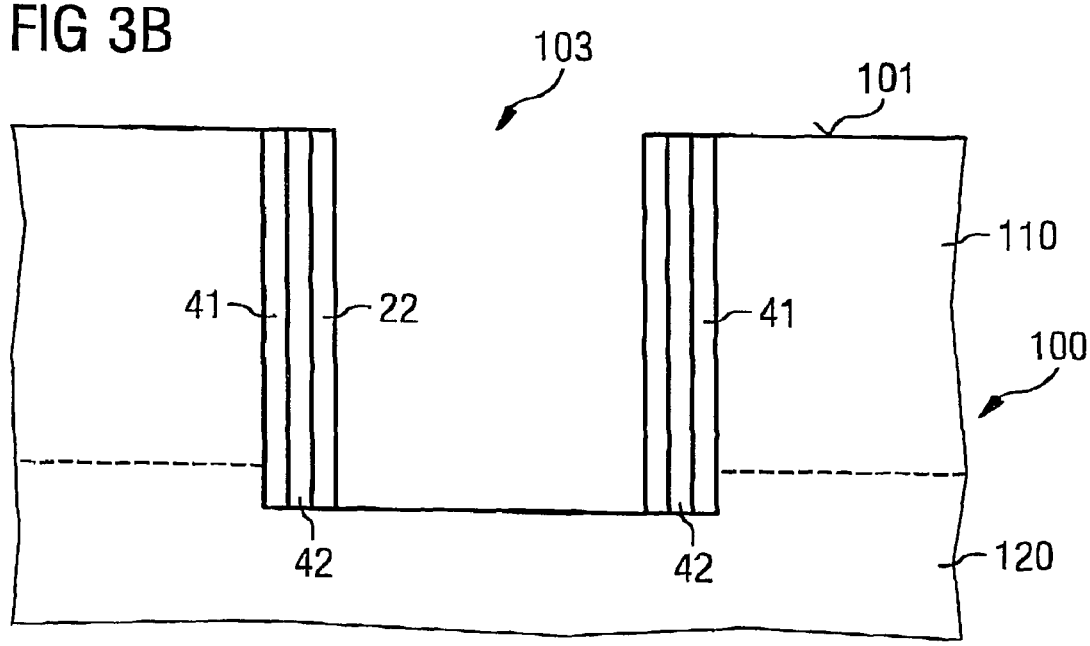

SEMICONDUCTOR COMPONENT COMPRISING A DRIFT ZONE AND A DRIFT CONTROL ZONE

FIELD

The present invention relates to a semiconductor component, in particular a power semiconductor component, which has a drift zone and a drift control zone composed of a semiconductor material, which drift control zone is arranged adjacent to the drift zone and is dielectrically insulated from the drift zone and serves for controlling a conducting channel in the drift zone when the component is driven in the on state.

BACKGROUND

Such a semiconductor component is described in the applicant's international application PCT/EP 2006/007450, which has not yet been published.

In order to form a conducting channel in the drift zone, charge carriers are required in the drift control zone. The charge carriers are fed to the drift control zone when the component is driven in the on state and provide for the formation of the accumulation channel in the drift zone along a dielectric that separates the drift zone and the drift control zones. When the component is driven in the off state, the charge carriers flow away from the drift control zone or are buffer-stored in a capacitance until the next instance of driving in the on state. This charge-reversal operation of the drift control zone critically influences the switching delay of the component, that is to say the time duration required by a transition from an off state to an on state, and vice versa.

SUMMARY

A semiconductor component in accordance with an embodiment of the invention comprises a drift zone and a drift control zone, which is arranged adjacent to the drift zone and which is dielectrically insulated from the drift zone by a dielectric layer, wherein the drift control zone has at least one first and one second semiconductor layer, of which the first semiconductor layer has a higher charge carrier mobility than the second semiconductor layer.

A method for producing a drift control zone delimited by a dielectric layer in accordance with an embodiment of the invention comprises production of a trench, which has sidewalls and a bottom, in a semiconductor body. A sacrificial layer is produced on the sidewalls of the trench. A first layer composed of a first semiconductor material is applied to the sacrificial layer and a second layer composed of a second semiconductor material is applied to the first semiconductor layer. The first semiconductor material has a higher charge carrier mobility than the second semiconductor material. The method further comprises removal of the sacrificial layer and production of a dielectric layer in a cavity present after the removal of the sacrificial layer.

The above described features and advantages, as well as others, will become more readily apparent to those of ordinary skill in the art by reference to the following detailed description and accompanying drawings.

BRIEF DESCRIPTION OF THE DRAWINGS

FIG. 1 shows an exemplary embodiment of a semiconductor component according to the invention in cross section, which has a drift zone and a drift control zone having at least two semiconductor layers having different charge carrier mobilities.

DETAILED DESCRIPTION OF THE DRAWINGS

Figure 2A:
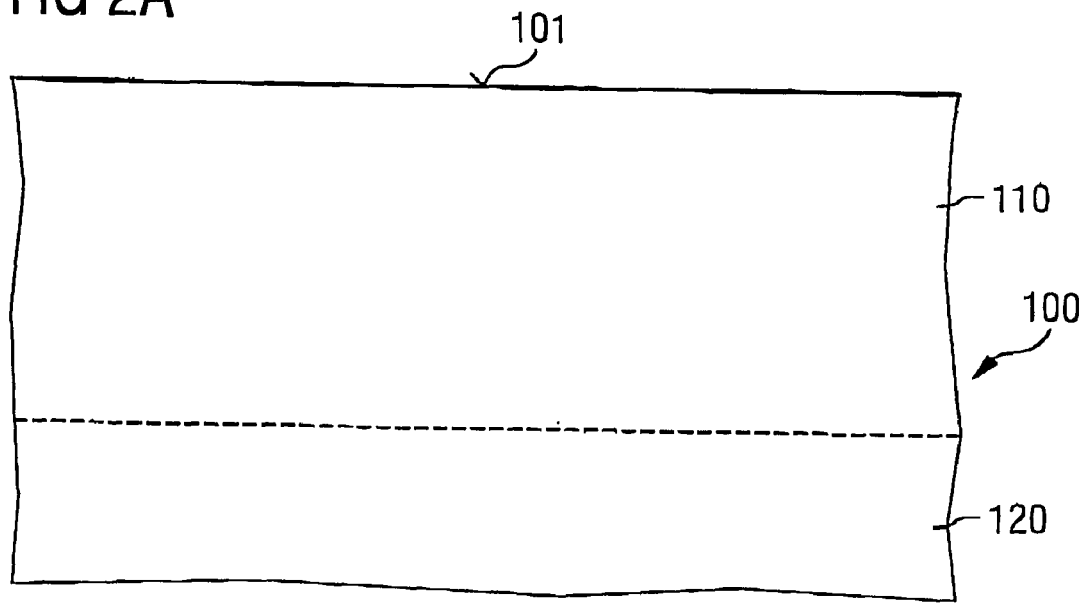
FIG. 2 illustrates a first example of a method for producing a drift control zone having at least two semiconductor layers.

In the figures, unless specified otherwise, identical reference symbols designate identical component regions with the same meaning.

A semiconductor component in accordance with an embodiment of the invention comprises a drift zone and a drift control zone, which is arranged adjacent to the drift zone and which is dielectrically insulated from the drift zone by a dielectric layer, wherein the drift control zone has at least one first and one second semiconductor layer, of which the first semiconductor layer has a higher charge carrier mobility than the second semiconductor layer.

The provision of a semiconductor layer having a higher charge carrier mobility in the drift control zone enables a more rapid introduction and flowing away of the charge carriers into the drift control zone which are required in the drift control zone for controlling an accumulation channel in the drift zone. This leads to an increase in the switching speed of the semiconductor component.

In this component, the first and the second semiconductor layer may be arranged adjacent to one another proceeding from the dielectric layer, in which case the first semiconductor layer may in particular be directly adjacent to the dielectric layer.

Silicon-germanium (SiGe), for example, is suitable as material for the first semiconductor layer, and silicon (Si), for example, is suitable as material for the second semiconductor layer. SiGe has a higher charge carrier mobility in comparison with Si, the charge carrier mobility increasing as the proportion of germanium (Ge) increases. Such an SiGe layer may be strained relative to the Si layer due to different crystal lattice constants of SiGe and Si, which has a positive effect on the charge carrier mobility.

FIG. 1 shows an exemplary embodiment of a semiconductor component according to the invention, which has a drift zone 12 and a drift control zone 20 composed of a semiconductor material. The semiconductor component is illustrated schematically in FIG. 1 in a sectional diagram showing a cross section through a semiconductor body 100, in which semiconductor component regions of the semiconductor component are integrated.

The component illustrated in FIG. 1 is realized as a MOS transistor. In this case, the drift zone 12 is arranged between a first component zone 11 and a second component zone 13 in the semiconductor body 100 in a current flow direction r1. In the case of the MOS transistor structure illustrated, the first component zone 11 is a drain zone, and the second component zone 13 is a body zone, to which a source zone 14 is adjacent at a side remote from the drift zone 12 in the current flow direction r1. A gate electrode 16 is present for controlling a conducting channel in the body zone 13 between the source zone 14 and the drift zone 12, the gate electrode being arranged adjacent to the body zone 13 and being dielectrically insulated from the body zone 13 by a gate dielectric layer 17—referred to hereinafter as gate dielectric for short.

Contact is made with the source zone 14 by a source electrode 18, which furthermore makes contact with the body zone 13 and thereby short-circuits the source zone 14 and the body zone 13. In the example illustrated, the source electrode 18 is connected to the body zone 13 via a connection zone 15, which is doped more highly than the body zone 13.

The transistor structure illustrated in FIG. 1 is a transistor structure of a normally off n-MOSFET. In this case, the source zone 14, the drift zone 12 and the drain zone 11 are n-doped and doped complementarily with respect to the p-doped body zone 13. In the case of this component, the gate electrode 16 serves for controlling an inversion channel in the body zone 13 between the source zone 14 and the drift zone 12. It should be pointed out that the specification of the doping types in FIG. 1 shall merely serve to facilitate the understanding of the invention on the basis of an exemplary embodiment. It goes without saying that the invention is not restricted to a normally off n-MOSFET, but rather can equally be applied to a p-MOSFET or an IGBT. In the case of a p-MOSFET, the component zones are doped complementarily with respect to the component zones illustrated in FIG. 1. In the case of an IGBT, the drain zone, which is also referred to as emitter zone, is doped complementarily with respect to the drift zone.

The MOS transistor illustrated in FIG. 1 has a vertical transistor structure. In this case, the drain zone 11, the drift zone 12, the body zone 13 and the source zone 14 are arranged adjacent to one another in a vertical direction of the semiconductor body 100. In the example illustrated, the vertical direction of the semiconductor component 100 corresponds to the current flow direction r1, in which a current flows through the drift zone 12 when the component is driven in the on state in a manner yet to be explained. The gate electrode 16 of the transistor illustrated is arranged in a trench and extends proceeding from a first side 101 of the semiconductor body 100, which is referred to hereinafter as the front side, in a vertical direction into the semiconductor body 100 and reaches—in each case in a manner insulated by the gate dielectric 17 from the source zone 14 via the body zone 13 right into the drift zone 12.

In a direction r2 that deviates from the current flow direction r1 and runs perpendicular to the current flow direction r1 in FIG. 1 for elucidation purposes, the drift control zone 20 is arranged adjacent to the drift zone 12. The drift control zone comprises a semiconductor material, in particular a monocrystalline semiconductor material, and is dielectrically insulated from the drift zone 12 by a dielectric layer 24, which is referred to hereinafter as drift control zone dielectric.

The semiconductor component can be constructed in cellular fashion, that is to say can have a multiplicity of transistor structures which are constructed in an identical manner and are connected in parallel and in each case have at least one drift control zone 20 arranged adjacent to a drift zone 12. The cells may be realized as so-called strip cells, in particular, in which case the component structures illustrated in FIG. 1 are then formed in elongated fashion in a direction perpendicular to the plane of the drawing illustrated.

In the example illustrated, the drift control zone 20 is connected to the drain zone 12 via a rectifier element 23. The rectifier element 23 is connected up in such a way that the magnitude of the electrical potential in the drift control zone 20 can rise above the value of an electrical potential of the drain zone 11, but that the electrical potential in the drift control zone 20 cannot fall below the electrical potential of the drain zone 11 or can fall below the electrical potential only by a defined value, in the example the forward voltage of the diode 23. In the example illustrated, the rectifier element is realized as a bipolar diode and integrated in the semiconductor body 100. In this case, the bipolar diode comprises two semiconductor zones 231, 232 which are doped complementarily with respect to one another and are arranged between the drain zone 11 and the drift control zone 20.

Instead of the bipolar diode between the drain zone 11 and the drift control zone 20, a Schottky diode may also be used, in a manner that is not specifically illustrated. A further variant (not illustrated) provides for providing between the drain zone 11 and the drift control zone 20 a component structure with a tunnel dielectric which makes it possible for the magnitude of the electrical potential of the drift control zone 20 to rise above the electrical potential of the drift zone 11.

The basic functioning of the component illustrated is explained below. The component turns on if an electrical potential, or relative to the source zone 14 an electrical voltage, is applied to the gate electrode 16, with the result that an inversion channel forms in the body zone 13 along the gate dielectric 17. The inversion channel enables an electron flow from the source zone 14 via the inversion channel in the body zone 13 and the drift zone 12 to the drain zone 11. At the same time, the drift control zone 20 is charged to an electrical potential which has a magnitude greater than the electrical potential of the drift zone 12 and which brings about the formation of an accumulation channel in the drift zone 12 along the drift control zone dielectric. In this case, the rectifier element 23 prevents the charge carriers required for the control of the accumulation channel from flowing away into the drain zone 11.

In the case of the n-conducting MOS transistor illustrated, positive charge carriers (holes) are required for the formation of an accumulation channel in the drift control zone 20, which charge carriers charge the drift control zone 20 positively relative to the drift zone 12. In this case, one portion of the charge carriers can be supplied by the drain zone 11 via the rectifier element, the drain zone, during normal operation of the component, being at an electrical potential that is greater than an electrical potential of the source zone 14 or body zone. A further—usually larger—portion of the charge can be supplied from the gate circuit via a charging circuit upon initial switch-on and can subsequently be buffer-stored in a storage capacitance.

In the example, the charging circuit comprises a further rectifier element, for example a diode, connected between the gate electrode 16 and a connection 25 of the drift control zone 20. The further rectifier element 31 is connected to an end of the drift control zone which is at a distance in the current flow direction from the end to which the drain zone 11 is connected. On the basis that the load path voltage or drain-source voltage when the component is driven in the on state is less than the applied gate-source voltage, the drift control zone 20 when the component is driven in the on state is charged to an electrical potential that is greater than the electrical potential of the drain zone 11 and hence greater than the electrical potential of the drift zone 12.

If the component is driven in the off state by means of the gate electrode being discharged to source potential, by way of example, then the inversion channel in the body zone 13 is interrupted and, proceeding from a pn junction between the body zone 13 and the drift zone 12 doped complementarily with respect thereto, a space charge zone propagates in the drift zone 12 in the direction of the drain zone 11. The space charge zone propagates further in the direction of the drain zone 11 as the load path voltage or drain-source voltage increases.

When the component is driven in the off state, the drain potential rises in comparison with the source potential. Correspondingly, due to the coupling of the drain zone 11 to the drift control zone 20, the electrical potential in the drift control zone 20 rises relative to the source potential, the rectifier element 31 of the charging circuit preventing the electrical potential of the drift control zone 20 from following the electrical potential of the gate electrode. In this case, the charge carriers that previously flowed into the drift control zone 20 with the component driven in the on state are shifted from the drift control zone 20 into a storage capacitance.

The storage capacitance may be realized as a capacitor, for example, which is connected between the connection 25 of the drift control zone 20 and the source zone 14. The storage capacitance may also be formed by a capacitance between a semiconductor zone 26, 27 doped complementarily with respect to the drift control zone 20 and the body zone 14 or the connection zone 15 thereof. In this case, the semiconductor zone 26, 27 doped complementarily with respect to the drift control zone 21 is arranged between the drift control zone 21 and the front side 101 of the semiconductor body 100 and is separated from the body zone 13 and the connection zone 15, which are each at source potential, by a section of the drift control zone dielectric 24 that reaches as far as the front side 101. In the example illustrated, the complementarily doped semiconductor zone 26, 27 is arranged in a manner contact-connected by the connection 25 of the drift control zone 20 at an end of the drift control zone 20 that is remote from the drain zone 11, and in the example comprises a more highly doped and a more lightly doped semiconductor section 27, 26.

When the component is driven in the off state, a space charge zone additionally propagates in the current flow direction in the drift control zone 20, within which the electrical potential increases in the drift control zone 21, in the example in the direction of the rear side 102. In this case, the drift control zone 21 is doped sufficiently lightly that such a space charge zone can propagate. In this case, the diode 31 between the gate electrode 16 and the drift control zone 22 prevents charge carriers stored in the external capacitance or in the internal capacitance from flowing away into the gate circuit. Optionally, a further rectifier element may be provided, for example in the form of a diode 32, which is connected between the drift control zone 20 and the source zone 14. The further diode 32 limits a voltage across the internal or external storage capacitance and enables charge carriers to flow away to the source zone in the event of an overvoltage. Such an overcurrent need not then flow away via the gate circuit. A voltage rise in the drift control zone 20 in the direction of the drain zone 11 due to the space charge zone propagating in the drift control zone 20 reduces the voltage drop across the drift control zone dielectric 24 in comparison with a theoretical case in which the entire drift control zone 20 is at drain potential.

In the case of the semiconductor component illustrated, the drift control zone 20 serves for controlling a conducting channel in the drift zone 12 along the drift control zone dielectric 24. In this case, the drift control zone 20 brings about a reduction of the on resistance of the component in comparison with semiconductor components which have a drift zone having an identical doping but no drift control zone. As an alternative, the drift control zone 20 enables a reduction of the doping concentration of the drift zone 12, and hence an increase in the dielectric strength of the component for the same on resistance. The provision of such a drift control zone 20 even makes it possible to use an undoped or intrinsic drift zone 12. Furthermore, the drift zone 12 may even be realized complementarily with respect to the drain zone 11, which is illustrated by parentheses in FIG. 1. In the case of such a component in which the drift control zone then controls an inversion channel in the drift zone 12, in the off-state case a space charge zone propagates proceeding from the pn junction between the drain zone 11 and the drift zone 12, whereby the gate dielectric 17 is reliably protected against high voltage loadings in the off-state case. In this context, it should be pointed out that the drift control zone 20 may be doped by the same conduction type as the drift zone 12 or complementarily with respect to the drift zone 12; the drift control zone may, in particular, also be intrinsic.

If the gate electrode 16 (as illustrated) is realized such that the inversion channel runs in a lateral direction of the semiconductor body at a distance from the accumulation channel along the drift control zone dielectric 24, in this variant a semiconductor zone (not illustrated) of the same conduction type as the drain zone 11 may be provided which extends in a lateral direction below the body zone 13 from the inversion channel that forms along the gate dielectric 17 as far as the accumulation channel along the drift control zone dielectric 24.

The charge reversal of the drift control zone between on-state and off-state driving of the component critically influences switching delays of the component. In order to reduce the switching delays, the drift control zone 20 has at least one first and one second semiconductor layer 22, 21, of which the first semiconductor layer has a higher charge carrier mobility, a higher hole mobility in the example illustrated, than the second semiconductor layer. In the example illustrated, the drift control zone 20 has, proceeding from the drift control zone dielectric 24, i.e. in a direction transversely with respect to the current flow direction rl, a sequence of two semiconductor layers, a first semiconductor layer 22 and a second semiconductor layer 21, of which the first semiconductor layer 22 has a higher hole mobility than the second semiconductor layer 21. In this case, it is assumed that two drift control zones 20 are arranged in a trench, each of which zones is assigned to a transistor cell and occupies half of the trench. In the case of so-called strip cells, in which the component structures illustrated in the figure run in elongated fashion in a direction perpendicular to the plane of the drawing illustrated, a first drift control zone controls an accumulation channel in the drift zone to the left of the trench, and a second drift control zone controls an accumulation channel in the drift zone to the right of the trench. In the case of so-called polygonal cells, the drift zone 12 may have in cross section a polygonal cross section and may be completely surrounded by the drift control zone 20, or vice versa. The drift control zone 20 is then adjacent to the drift zone 12 at more than two sides (not illustrated).

The first semiconductor layer comprises silicon-germanium (SiGe), by way of example, while the second semiconductor layer comprises silicon (Si), by way of example. SiGe has a significantly higher charge carrier mobility than Si, the charge carrier mobility increasing as the proportion of germanium (Ge) increases.

The first semiconductor layer 22, which is formed directly adjacent to the drift control zone dielectric 24 in the example, brings about a more rapid charge reversal of the drift control zone during switching operations on account of the higher charge carrier mobility and thereby brings about a reduction of the switching delays. Moreover, the switching losses can thereby be reduced. Between strained SiGe and Si, there is a band edge offset between the valence band edges, which is all the greater, the greater the Ge proportion in the SiGe used. The band edge offset has the effect that the transition region between the SiGe layer 22 and the Si layer 21 represents a barrier for charge carriers, with the result that the charge carriers are "guided" in the SiGe layer 22 during the charge-reversal processes, which may additionally contribute to an acceleration of the charge-reversal processes.

A thickness d1 of the first semiconductor layer 22 may lie between 5 nm and 200 nm, and may in particular be less than 100 nm and lie within the range of 5 . . . 30 nm. Customary further dimensions of a component having a dielectric strength of 600 V shall be specified for comparison. In this case, the length of the drift zone 12 lies between 30 µm and 60 µm, the width of the trench with the drift control zone lies between 2 µm and 6 µm, and the thickness of the drift control zone dielectric 24 is in the region of approximately 100 nm. In this case, a thickness of the second semiconductor layer 21 is significantly greater than the thickness of the first semiconductor layer 22, in each case considered in a direction perpendicular to the current flow direction r1.

A semiconductor layer 19 may optionally be provided in the drift zone 12 along the drift control zone dielectric 24, the semiconductor layer including a semiconductor material having a higher charge carrier mobility than remaining regions of the drift zone 12. The semiconductor layer 19 for example likewise comprises SiGe, while the remaining regions comprise Si, for example. SiGe has a higher charge carrier mobility than Si both in the case of holes and in the case of electrons, even if it is applied in strained fashion on silicon. In the drift zone, this higher electron mobility leads to a reduction of the on resistance, which may also contribute to a reduction of switching times and switching losses.

It should be pointed out that the provision of a drift control zone 20 having two semiconductor layers 21, 22 having different charge carrier mobilities is not restricted to the component geometry illustrated in FIG. 1. Rather, this concept can be applied to any semiconductor components having a drift zone and a drift control zone adjacent to the drift zone. The concept can in particular also be applied to lateral transistors in which the source zone is arranged at a distance from the drain zone in a lateral direction of a semiconductor body and in which the drift zone and the drift control zone extend in a lateral direction.

An exemplary embodiment of a method for producing a drift control zone having at least two semiconductor layers having different charge carrier mobilities is explained below with reference to FIGS. 2A to 2K. These figures in each case show cross sections through a semiconductor body 100 during or after different method steps of the method have been carried out.

FIG. 2A shows the semiconductor body 100 at the beginning of the method. The semiconductor body has a first side 101, which is referred to hereinafter as the front side. The semiconductor body 100 may comprise a plurality of semiconductor layers, in particular a semiconductor substrate 120 and an epitaxial layer 110 applied to the semiconductor substrate 120. The semiconductor substrate 120 may be highly doped and may form the later drain zone (11 in FIG. 1) of a MOS transistor during the production of the transistor. The epitaxial layer 110 may have a basic doping and may be used in the production of a MOS transistor for the realization of the source zone, the body zone and the drift zone. In this case, sections of the epitaxial layer 110 which have the basic doping may form the later drift zone (12 in FIG. 1).

Figure 2B:
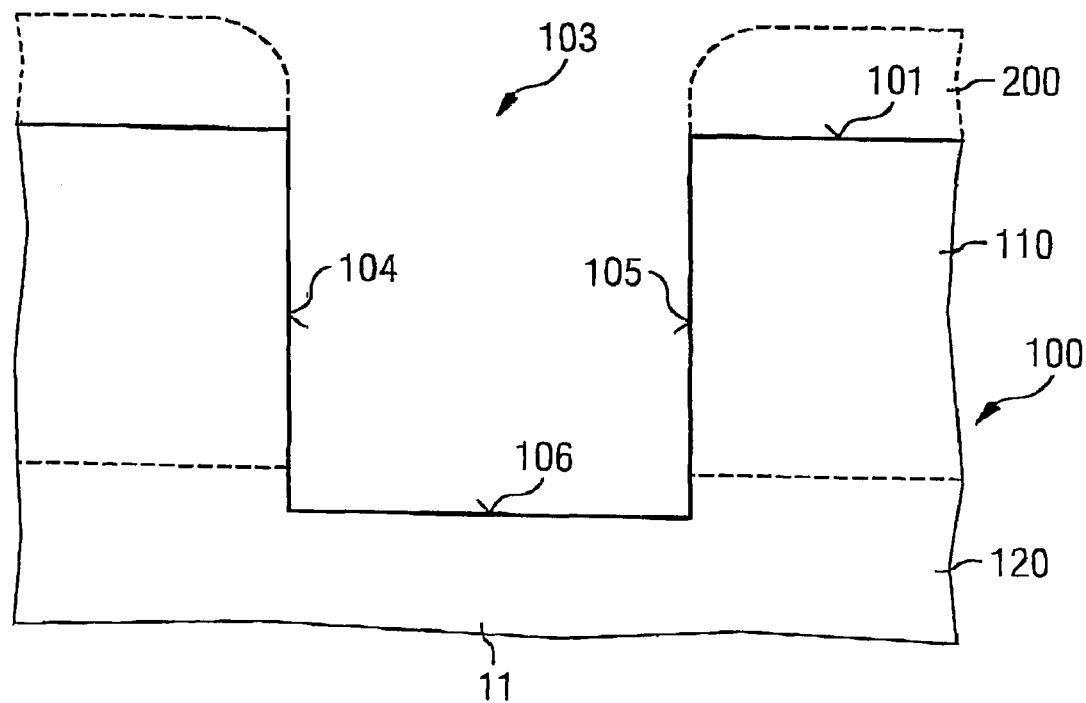

FIG. 2B shows the semiconductor body 100 after first method steps have been carried out, the first method steps involving the production of a trench 103, which extends proceeding from the front side 101 in a vertical direction into the semiconductor body 100. The production of the trench 103 may be effected for example by means of an anisotropic etching method using a patterned mask 200 applied to the front side 101. The trench produced by these method steps has sidewalls 104, 105 and a bottom 106 and, in the case of a semiconductor body 100 constructed in multilayer fashion, may reach right into the highly doped semiconductor substrate 120.

A sacrificial layer is subsequently produced on the sidewalls 104, 105 of the trench 103, the sacrificial layer being removed again later prior to the production of the drift control zone dielectric (24 in FIG. 1). The sacrificial layer may be an oxide layer or a porous semiconductor layer. Referring to FIGS. 2C and 2D, the sacrificial layer may also be constructed in multilayer fashion and may be for example an oxide layer 41 or porous silicon layer.

FIG. 2C shows the semiconductor body 100 after the production of the oxide layer 41 on the sidewalls 104, 105 of the trench. The oxide layer 41 may be effected by thermal oxidation of the semiconductor body 100 or by deposition of an oxide layer and a subsequent anisotropic etching step. By means of the anisotropic etching step, the thermally grown or deposited oxide layer is removed from the front side 101 of the semiconductor body and from the bottom 106 of the trench.

FIG. 2D shows the semiconductor body 100 after the production of a semiconductor layer 42, which, by way of example, is deposited conformally on the side walls and on the bottom 106 of the trench and serves as an auxiliary layer. The semiconductor layer is optionally present and may in particular also be deposited onto the front side 101 of the semiconductor body 100.

Figure 2E:
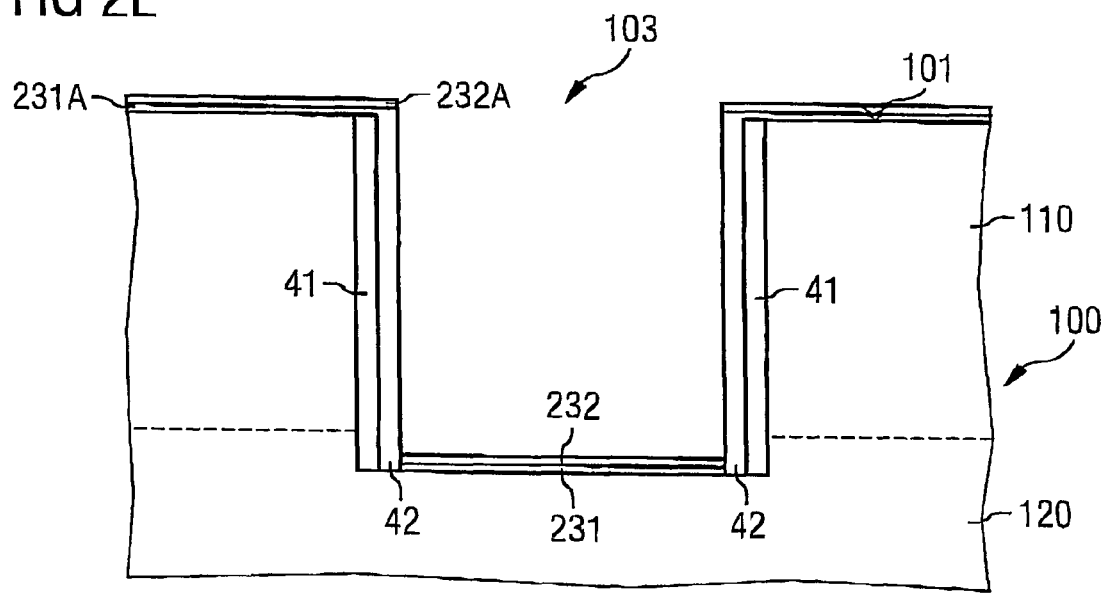

Referring to FIG. 2E, dopant atoms are subsequently introduced into the semiconductor body 100 via the bottom 106 of the trench 103 in such a way that two semiconductor zones 231, 232 doped complementarily with respect to one another arise in the bottom region 106, the semiconductor zones being arranged adjacent to one another in the vertical direction of the semiconductor body 100. In this case, one or both of the semiconductor layers 231, 232 may be partly or completely arranged in the previously deposited semiconductor layer 42, which forms a part of the sacrificial layer on the sidewalls of the trench 103.

The production of the two semiconductor zones 231, 232 doped complementarily with respect to one another, which, in the finished component, form a bipolar diode (23 in FIG. 1) between the component zone formed by the semiconductor substrate 120 and the later drift control zone, is effected for example by implantation of dopant atoms via the bottom of the trench 103. A production of the two semiconductor zones 231, 232 in different depths proceedings from the bottom 106 of the trench may be effected in this case by using different implantation energies. The two semiconductor zones 231, 232 may be produced such that they are directly adjacent to one another. Furthermore, there is also the possibility of providing a more weakly doped semiconductor zone of one of the two conduction types between the semiconductor zone 231, which is arranged deeper in the semiconductor body and is doped complementarily with respect to the semiconductor substrate 120, and the semiconductor zone 232, which is arranged nearer to the bottom of the trench and is of the same conduction type as the semiconductor substrate 120. In this method, the semiconductor layer 42 serving as a sacrificial layer on the sidewalls may be deposited as a doped semiconductor layer, and the implantation of the dopants for producing the complementarily doped semiconductor zones 231, 232 may be effected such that there remains between the semiconductor zones 231, 232 a semiconductor section which results from the semiconductor layer 42 and which has a basic doping of the semiconductor layer.

The introduction of the dopant atoms for producing the semiconductor zones 231, 232 may be effected using a mask that prevents dopant atoms from being introduced into the semiconductor body 100 via the front side 101. However, the introduction of the dopant atoms may also be effected in unmasked fashion, as is illustrated in FIG. 2E, as a result of which semiconductor zones 231A, 232A doped complementarily with respect to one another also arise in the region of the front side 101.

Figure 2F:
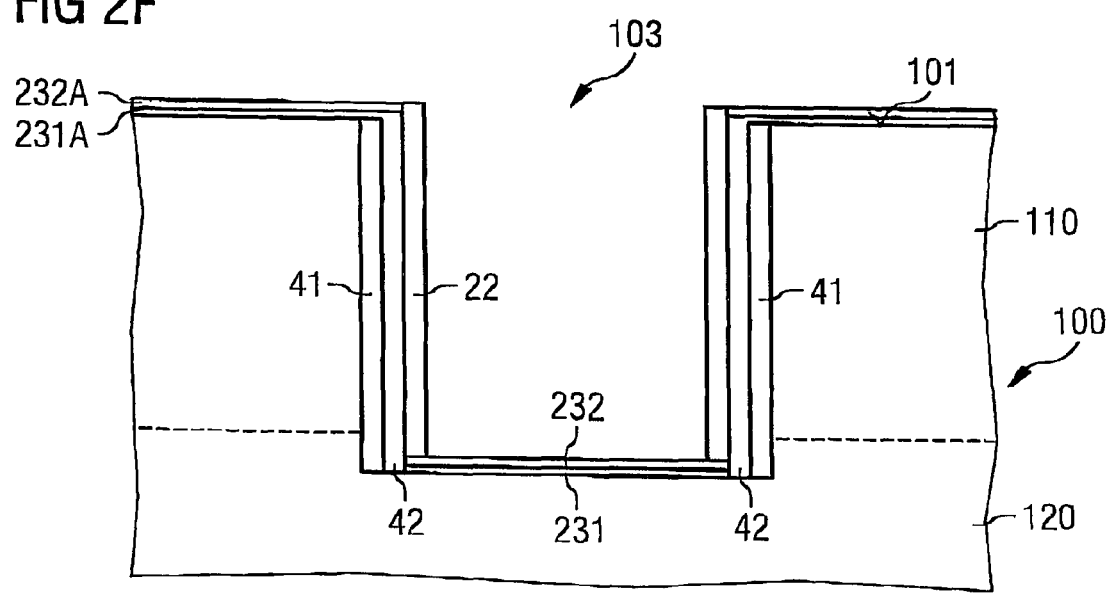
Figure 2G:
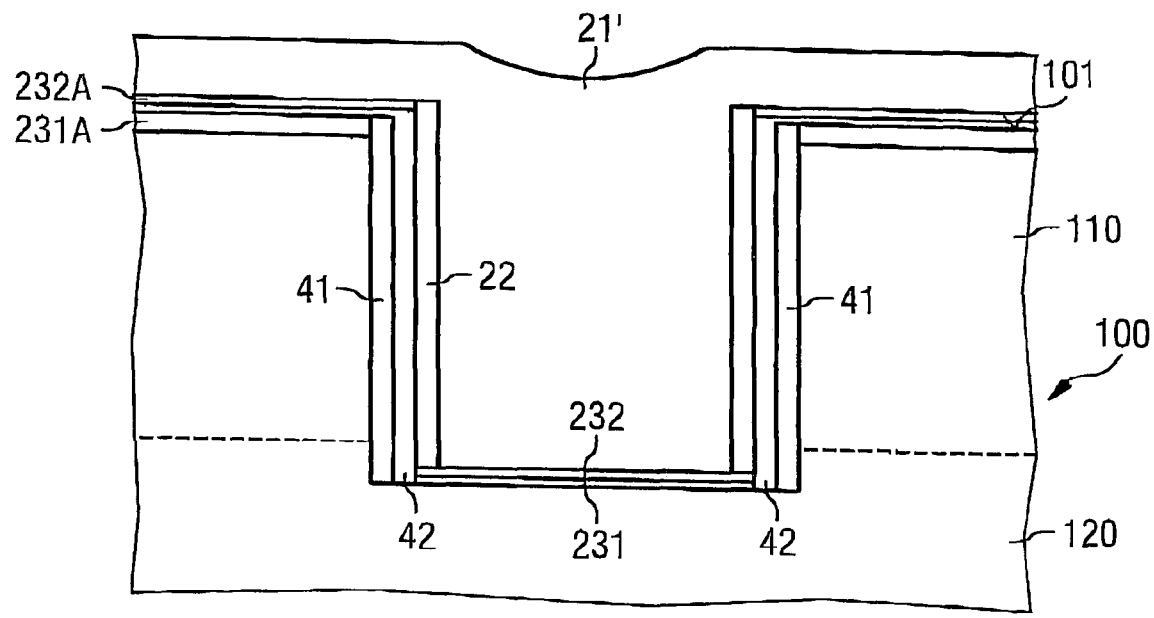

FIG. 2F shows the semiconductor body 100 after further method steps have been carried out, the further method steps involving the application of a further semiconductor layer 22 to the layers 41, 42 on the sidewalls of the trench 103. The further semiconductor layer 22 forms the first semiconductor layer of the later drift control zone and comprises a semiconductor material having a higher charge carrier mobility, in particular a higher hole mobility, in comparison with silicon. Such a material is SiGe, for example, which is applied in monocrystalline fashion and in strained fashion to the semiconductor layer 42 composed of silicon. The production of the semiconductor layer 22 on the sidewalls of the trench is effected for example by conformal deposition of a semiconductor layer and subsequent anisotropic etching back, whereby the previously deposited semiconductor layer is removed above the front side 101 and above the bottom of the trench.

There is optionally the possibility of producing such a semiconductor layer 19 having increased charge carrier mobility in the trench 103 before the sacrificial layer 41 is actually produced, which is illustrated by dashed lines in FIG. 1. The semiconductor layer 19 including SiGe, for example, is arranged in the drift zone (12 in FIG. 1) in the finished component. The production of this optional semiconductor layer may likewise be effected by deposition and anisotropic etching back.

The trench that remains after the production of the first semiconductor layer 22 is subsequently filled with a semiconductor material 21', which forms the later second semiconductor layer 21 of the drift control zone. This is illustrated as the result in FIG. 2G. The filling of the trench may be effected in particular by means of an epitaxial deposition process by means of which doped or undoped silicon grows epitaxially on uncovered regions of the semiconductor body 100 and the first semiconductor layer 222.

Figure 2H:
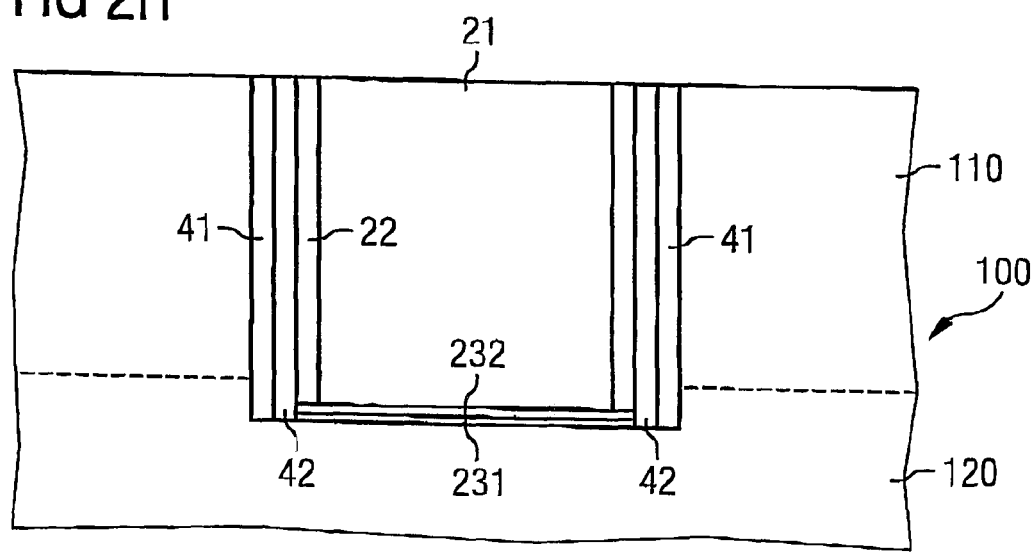
Figure 2I:
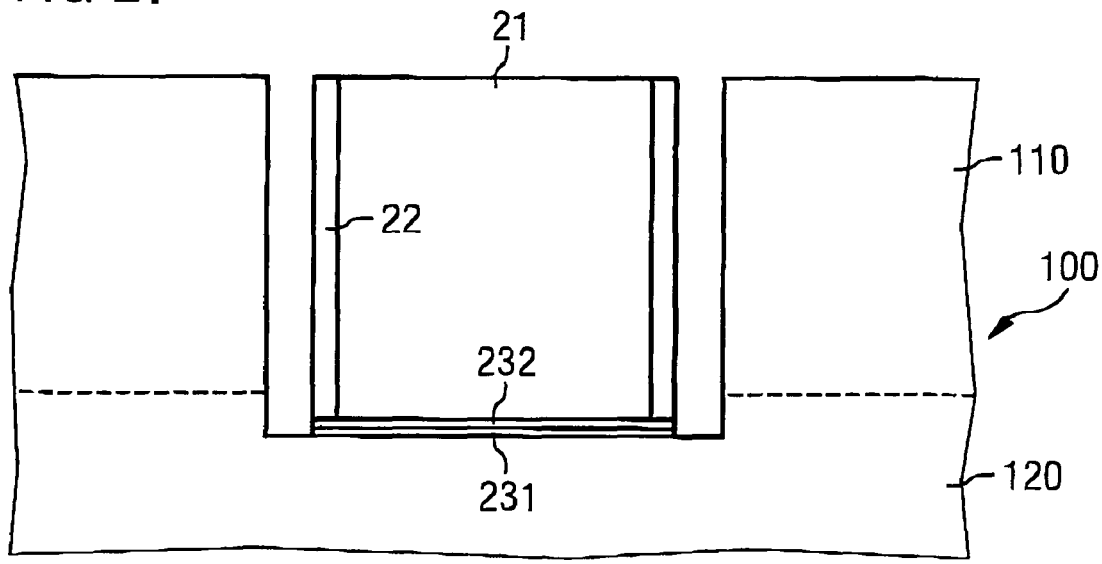
Figure 2J:
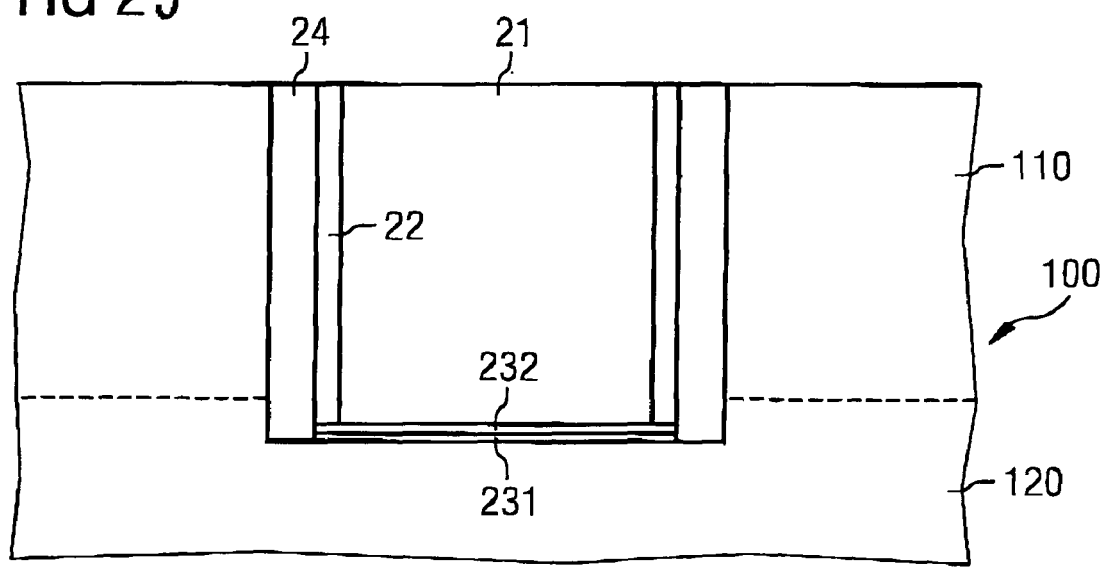

In order to complete the drift control zone 21, 22, excess second semiconductor material 21' is subsequently removed, which is illustrated as the result in FIG. 2H. The removal is effected for example by means of a CMP process (CMP=chemical mechanical polishing). This planarization process may be effected in particular in such a way that, apart from the excess semiconductor material 21', the semiconductor layer 42 is also removed above the front side 101. If the doping processes for producing the semiconductor zones 231, 232 are effected in non-masked fashion, a region of the semiconductor body 100 which is near the surface may also be removed by means of the planarization or removal process in order likewise to remove doped regions of the semiconductor body 100 that are near the surface during the doping process.

The drift control zone dielectric 24 is subsequently produced in the region between the first semiconductor layer 22 and the semiconductor material of the semiconductor body 100, which is illustrated as the result in FIG. 2K. The production of the drift control zone dielectric 24 comprises the removal of the sacrificial layer by means of a selective etching process which etches the sacrificial layer 41 but not the remaining regions of the component structure. There are various variants with regard to the treatment of the semiconductor layer 42.

A first variant provides for removing the semiconductor layer 42 likewise by means of an etching process, which is illustrated as the result in FIG.†2I, and for subsequently filling the resultant trench with a dielectric material which forms the drift control zone dielectric 24.

A second variant provides for carrying out a thermal process after the removal of the sacrificial layer 41, the semiconductor layer 42 being thermally oxidized by the thermal process. This oxidation process is self-limiting insofar as SiGe cannot be thermally oxidized, with the result that although the semiconductor layer 42 is oxidized, the first semiconductor layer 22 of the drift control zone is not oxidized. Moreover, during this oxidation process, at the opposite side of the trench produced after the removal of the sacrificial layer 41, toward the later drift zone 12, a semiconductor material of the semiconductor body is oxidized until the trench is completely filled with semiconductor oxide. If a "residual" trench is still present after a complete oxidation of the semiconductor layer, the trench can be filled by deposition of a dielectric as an alternative to a thermal oxidation. In this method, the oxidized semiconductor layer 42 forms a part of the drift control zone dielectric 24.

A third variant provides, after a removal of the sacrificial layer 41, for oxidizing the semiconductor layer 42 in the trench present after the removal of the sacrificial layer partly but not continuously as far as the first semiconductor layer 22. A layer stack composed of a non-oxidized residue of the semiconductor layer 42 and an oxidized part of the semiconductor layer 42 then remains on the first semiconductor layer 22. A further filling of the trench may be effected by means of a deposited dielectric. In this case, the drift control zone has a three-layer structure including, proceeding from the drift control zone dielectric, a layer composed of the second semiconductor material, for example Si, the first layer composed of the first semiconductor material, for example SiGe, and the second layer composed of the second semiconductor material. In this case, the first layer is spaced apart from the drift control zone dielectric transversely with respect to the current flow direction.

By means of such thermal oxidation processes or deposition processes, it is true that regions of the semiconductor body 100 and also of the second semiconductor layer 21 of the drift control zone which are near the surface are also oxidized. However, the subsequent etching process, which is chosen such that it etches semiconductor oxide selectively with respect to semiconductor material, subsequently removes the oxide near the surface.

The method steps explained above may be followed by conventional method steps for producing the further component structures illustrated by way of example in FIG. 1.

A further exemplary embodiment of a method for producing a drift control zone having two semiconductor layers is explained below with reference to FIGS. 3A to 3D. This method differs from the method explained above by virtue of the fact that the semiconductor layer 42 is only produced on the sidewalls of the trench 103. For this purpose, the deposited semiconductor material is etched back anisotropically after deposition, for example, which is illustrated as the result in FIG. 3A.

The production of the semiconductor layer 42 is followed, referring to FIG. 3B, by the production of the first semiconductor layer 22 of the later drift control zone. The production of the first semiconductor layer 24 may be effected in a manner corresponding to the explanations concerning FIG. 2F.

A semiconductor layer 43 is optionally deposited, for example by conformal deposition, onto the resultant arrangement. The layer may be more lightly doped than the semiconductor substrate and may serve for realizing the semiconductor layers 231, 232 which form the bipolar diode 23. The provision of said semiconductor layer affords the advantage that the semiconductor substrate 120, which may be very highly doped, does not have to be locally redoped for realizing the diode 23.

Figure 3C:
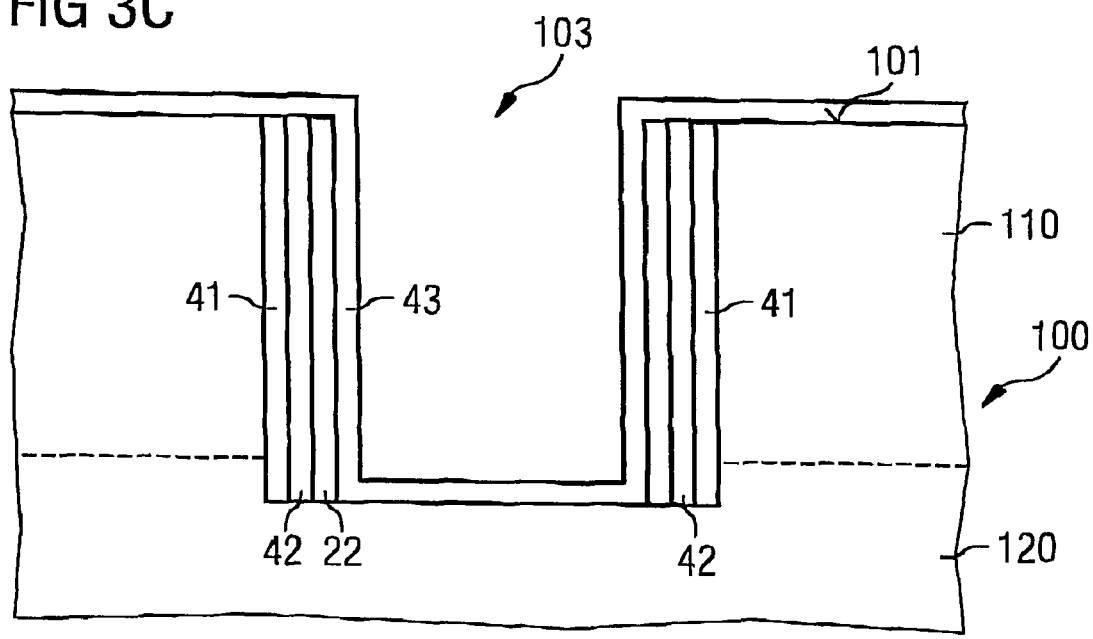
FIG. 3 illustrates a second example of a method for producing a drift control zone having at least two semiconductor layers.
Figure 3D:
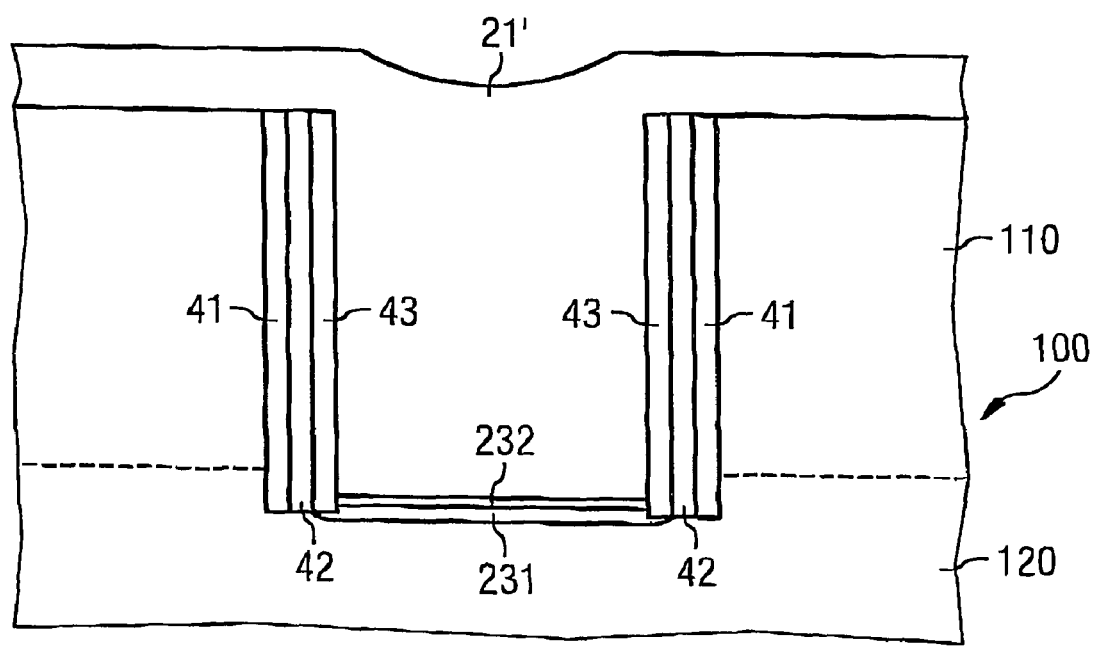

FIG. 3D shows the semiconductor body after further method steps have been carried out, the further method steps involving the introduction of dopant atoms for producing the complementarily doped semiconductor zone 231, 232 into the semiconductor body via the bottom of the trench 103. The method steps explained with reference to FIG. 2E, in particular, are suitable for the production of the semiconductor zones. In this context, it should be pointed out that during the production of the semiconductor zones 231, 232, a diffusion of dopant atoms in a lateral direction always takes place as well, thereby ensuring that the semiconductor zone 22 is separated from the substrate 120 by a highly doped semiconductor section of the same doping type as the substrate 120 and a semiconductor section doped complementarily with respect to the substrate 120, and is therefore separated from the later drain zone by a pn junction. The production of the semiconductor zones is followed by the filling of the trench with the second semiconductor material 21', which is likewise illustrated as the result in FIG. 3D.

These method steps explained with reference to FIGS. 3A to 3D are followed by the further method steps already explained above, in particular a planarization, a removal of the sacrificial layer and a production of the drift control zone dielectric.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A semiconductor component comprising:
    a drift zone;
    a drift control zone arranged adjacent to the drift zone in a first direction and dielectrically insulated from the drift zone by a dielectric layer in the first direction, the drift control zone including at least one first semiconductor layer and one second semiconductor layer which are adjacent to each other in the first direction, wherein the first semiconductor layer has a higher charge carrier mobility than the second semiconductor layer.

2. The semiconductor component as claimed in claim 1, wherein the first semiconductor layer and the second semiconductor layer are arranged adjacent to one another proceeding from the dielectric layer.

3. The semiconductor component as claimed in claim 1, wherein the first semiconductor layer is directly adjacent to the dielectric layer.

4. The semiconductor component as claimed in claim 1, wherein a thickness of the first semiconductor layer is smaller than a thickness of the second semiconductor layer.

5. The semiconductor component as claimed in claim 1, wherein the first semiconductor layer comprises silicon-germanium and the second semiconductor layer comprises silicon.

6. The semiconductor component as claimed in claim 1, wherein the first semiconductor layer and the second semiconductor layers are doped.

7. The semiconductor component as claimed in claim 1, wherein the first semiconductor layer and the second semiconductor layers are undoped.

8. The semiconductor component as claimed in claim 1, wherein the drift zone is arranged between a first component zone and a second component zone, and wherein the drift control zone is coupled to the first component zone.

9. The semiconductor component as claimed in claim 8, wherein the semiconductor component is a MOS transistor, wherein the first component zone forms a drain zone and the second component zone forms a body zone, the semiconductor component further comprising,
    a source zone separated from the drift zone by the body zone, and
    a gate electrode arranged adjacent to the body zone and dielectrically insulated from the body zone by a gate dielectric layer.

10. The semiconductor component as claimed in claim 9, wherein the drift control zone is coupled to the gate electrode at a side remote from the drain zone.

11. The semiconductor component as claimed in claim 1, wherein in the first direction, the drift zone, the dielectric layer, and the drift control zone are arranged in sequence.

12. The semiconductor component as claimed in claim 11, further comprising a top surface, and wherein the first direction is substantially parallel to the top surface.

13. The semiconductor component as claimed in claim 1, further comprising a top surface, and wherein the first direction is substantially parallel to the top surface.

\* \* \* \* \*